(12) United States Patent
Thees et al.

(10) Patent No.: US 8,748,275 B2
(45) Date of Patent: Jun. 10, 2014

(54) SEMICONDUCTOR DEVICES COMPRISING A CHANNEL SEMICONDUCTOR ALLOY FORMED WITH REDUCED STI TOPOGRAPHY

(75) Inventors: Hans-Juergen Thees, Dresden (DE); Stephan Kronholz, Dresden (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 54 days.

(21) Appl. No.: 13/191,993

(22) Filed: Jul. 27, 2011

(65) Prior Publication Data

US 2012/0156846 A1  Jun. 21, 2012

(30) Foreign Application Priority Data

Dec. 16, 2010  (DE) .......................... 10 2010 063 296

(51) Int. Cl.
*H01L 21/76*  (2006.01)

(52) U.S. Cl.
USPC .............. 438/285; 257/E21.54; 257/E21.218; 438/400

(58) Field of Classification Search
USPC ............. 257/409, E21.54, E21.618; 438/400, 438/285
See application file for complete search history.

(56) References Cited

U.S. PATENT DOCUMENTS

| | | | | |
|---|---|---|---|---|
| 4,027,380 A | * | 6/1977 | Deal et al. ...................... | 438/227 |
| 5,268,324 A | * | 12/1993 | Aitken et al. .................. | 438/217 |
| 6,703,271 B2 | * | 3/2004 | Yeo et al. ....................... | 438/221 |
| 7,176,110 B2 | * | 2/2007 | van Bentum et al. .......... | 438/478 |
| 7,217,608 B1 | * | 5/2007 | Xiang ............................. | 438/199 |
| 7,282,402 B2 | * | 10/2007 | Sadaka et al. ................. | 438/221 |
| 7,407,860 B2 | * | 8/2008 | Kim et al. ...................... | 438/300 |
| 7,504,696 B2 | * | 3/2009 | Zhu et al. ....................... | 257/369 |
| 7,998,821 B2 | * | 8/2011 | Shih et al. ...................... | 438/301 |
| 8,048,748 B2 | * | 11/2011 | Kronholz et al. .............. | 438/289 |
| 8,173,501 B2 | * | 5/2012 | Kronholz et al. .............. | 438/218 |
| 8,236,654 B2 | * | 8/2012 | Kronholz et al. .............. | 438/275 |
| 8,247,282 B2 | * | 8/2012 | Kronholz et al. .............. | 438/199 |
| 8,288,825 B2 | * | 10/2012 | Chong et al. ................... | 257/369 |
| 2005/0035369 A1 | * | 2/2005 | Lin et al. ........................ | 257/194 |
| 2008/0029815 A1 | * | 2/2008 | Chen et al. ..................... | 257/347 |
| 2008/0079086 A1 | * | 4/2008 | Jung et al. ...................... | 257/369 |
| 2008/0099794 A1 | * | 5/2008 | Beyer et al. .................... | 257/255 |

(Continued)

FOREIGN PATENT DOCUMENTS

DE  102009021489 A1  11/2010  .......... H01L 21/8234

OTHER PUBLICATIONS

Widmann et al., "Technologie hochintegrierter Schaltungen," 2nd edition, Springer, Berlin, pp. 66-67, 1996.

(Continued)

*Primary Examiner* — Stephen W Smoot
*Assistant Examiner* — Edward Chin
(74) *Attorney, Agent, or Firm* — Amerson Law Firm, PLLC (57) ABSTRACT

In sophisticated semiconductor devices, a semiconductor alloy, such as a threshold adjusting semiconductor material in the form of silicon/germanium, may be provided in an early manufacturing stage selectively in certain active regions, wherein a pronounced degree of recessing and material loss, in particular in isolation regions, may be avoided by providing a protective material layer selectively above the isolation regions. For example, in some illustrative embodiments, a silicon material may be selectively deposited on the isolation regions.

24 Claims, 9 Drawing Sheets

(56) References Cited

U.S. PATENT DOCUMENTS

| | | | |
|---|---|---|---|
| 2009/0146180 A1* | 6/2009 | Huang et al. | 257/190 |
| 2009/0267158 A1* | 10/2009 | Hase | 257/369 |
| 2009/0291540 A1* | 11/2009 | Zhang et al. | 438/229 |
| 2010/0181598 A1* | 7/2010 | Sato et al. | 257/190 |
| 2010/0193881 A1* | 8/2010 | Kronholz et al. | 257/402 |
| 2010/0221883 A1* | 9/2010 | Kronholz et al. | 438/285 |
| 2010/0289089 A1* | 11/2010 | Carter et al. | 257/392 |
| 2010/0289090 A1* | 11/2010 | Kronholz et al. | 257/392 |
| 2010/0289094 A1* | 11/2010 | Reichel et al. | 257/409 |
| 2011/0027952 A1* | 2/2011 | Kronholz et al. | 438/231 |
| 2011/0156172 A1* | 6/2011 | Kronholz et al. | 257/402 |
| 2011/0210375 A1* | 9/2011 | Ikeda et al. | 257/192 |
| 2011/0269293 A1* | 11/2011 | Kronholz et al. | 438/421 |
| 2012/0156846 A1* | 6/2012 | Thees et al. | 438/285 |
| 2012/0161249 A1* | 6/2012 | Kronholz et al. | 257/402 |
| 2012/0164805 A1* | 6/2012 | Kronholz et al. | 438/276 |

OTHER PUBLICATIONS

Translation of Official Communication from German Patent Office for German Patent Application No. 10 2010 063 296.1 dated Jul. 6, 2011.

* cited by examiner

SEMICONDUCTOR DEVICES COMPRISING A CHANNEL SEMICONDUCTOR ALLOY FORMED WITH REDUCED STI TOPOGRAPHY

BACKGROUND OF THE INVENTION

1. Field of the Invention

Generally, the present disclosure relates to integrated circuits including advanced transistor elements, one type of which comprises a channel semiconductor alloy, such as a silicon/germanium alloy.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, e.g., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer.

When advancing to sophisticated gate architecture based on high-k dielectrics, additionally transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. The threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately adapt the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and thus the threshold voltages in a very advanced process stage.

Although the process strategy for providing a threshold adjusting semiconductor material in an early manufacturing stage, thereby enabling the adjustment of the electronic characteristics of sophisticated gate electrode structures in an early manufacturing stage, may present a very promising process strategy, it turns out, however, that nevertheless significant transistor non-uniformities may be introduced, in particular in isolation regions when incorporating the channel semiconductor alloy selectively in one type of active region, thereby significantly affecting the further processing, such as the patterning of the gate electrode structures, forming spacer elements and finally completing the transistor configuration, possibly in combination with additional interlayer dielectric materials, which may also have to be formed above the isolation regions having the increased surface topography.

With reference to FIGS. 1a-1h, a typical conventional process flow will now be described in order to illustrate the problems involved in forming a channel semiconductor alloy in more detail.

Figure 1A:
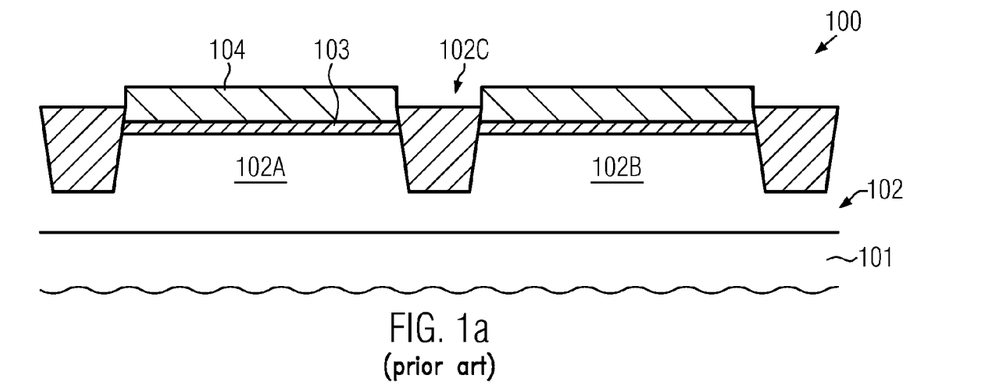
FIGS. 1a-1h schematically illustrate cross-sectional views of a semiconductor device during various manufacturing stages in forming transistors on the basis of a silicon/germanium alloy selectively formed in one type of active region according to conventional process strategies, thereby causing a pronounced surface topography, in particular in isolation regions.

FIG. 1a schematically illustrates a cross-sectional view of a semiconductor device 100 comprising a substrate 101 and a silicon-based semiconductor layer 102, which may be a portion of a crystalline substrate material of the substrate 101, when a bulk configuration is considered. The semiconductor layer 102 is laterally delineated in a plurality of active regions, i.e., semiconductor regions in and above which transistors are to be formed. For convenience, a first active region 102A and a second active region 102B are illustrated in FIG. 1a and these active regions are laterally delineated by an isolation region 102C, such as a shallow trench isolation. In the example shown, the active region 102A corresponds to a semiconductor region in and above which a transistor is to be formed, which does not require the incorporation of a specific channel semiconductor material, while on the other hand the active region 102B corresponds to the semiconductor region of a transistor in which an appropriate channel semiconductor material is to be formed, for instance in the form of a silicon/germanium alloy, as is also discussed above. Furthermore, in the manufacturing stage shown, a pad oxide layer 103, i.e., a thin silicon dioxide material, is formed on the active regions 102A, 102B, followed by a silicon nitride layer 104.

The semiconductor device 100 is typically formed on the basis of the following process strategy. At an initial manufacturing stage, the layers 103 and 104 are provided, for instance, by performing an oxidation process in order to obtain the layer 103 with a desired thickness, for instance in the range of 5-8 nm, followed by a deposition process for providing a silicon nitride material having a thickness of 10-20 nm, depending on the further processing. To this end, any well-established deposition recipes are applied. Thereafter, sophisticated lithography techniques are used in order to form an etch mask (not shown), which in turn defines the lateral position, size and shape of corresponding trenches to be formed in the semiconductor layer 102. To this end, the silicon nitride layer 104 is patterned to receive corresponding trenches and the layer is then used as a hard mask for etching through the pad oxide 103 and into the semiconductor material of the layer 102. Thereafter, the trenches are filled with an appropriate dielectric material, such as silicon dioxide, possibly in combination with any oxidation processes, wherein any excess material is removed by chemical mechanical polishing (CMP), wherein the silicon nitride material 104 acts as an efficient stop material. Due to a difference in the removal rate, a certain degree of recessing of the isolation structure 102C may be created, as illustrated in FIG. 1a.

Figure 1B:
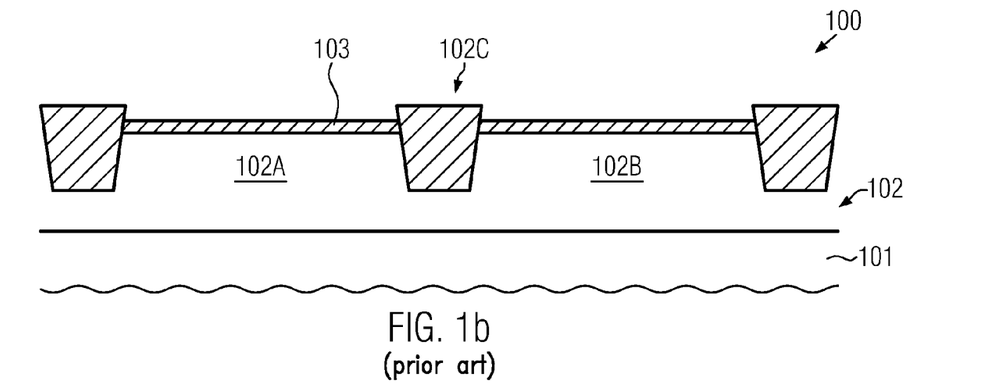

FIG. 1b schematically illustrates the device 100 after the removal of the silicon nitride material 104 (FIG. 1a), which is accomplished on the basis of selective etch chemistries, such as hot phosphoric acid, possibly in combination with APM (ammonium hydroxide/hydrogen peroxide mixture). It should be appreciated that the isolation regions 102C may still exhibit a substantially uniform surface topography.

Figure 1C:
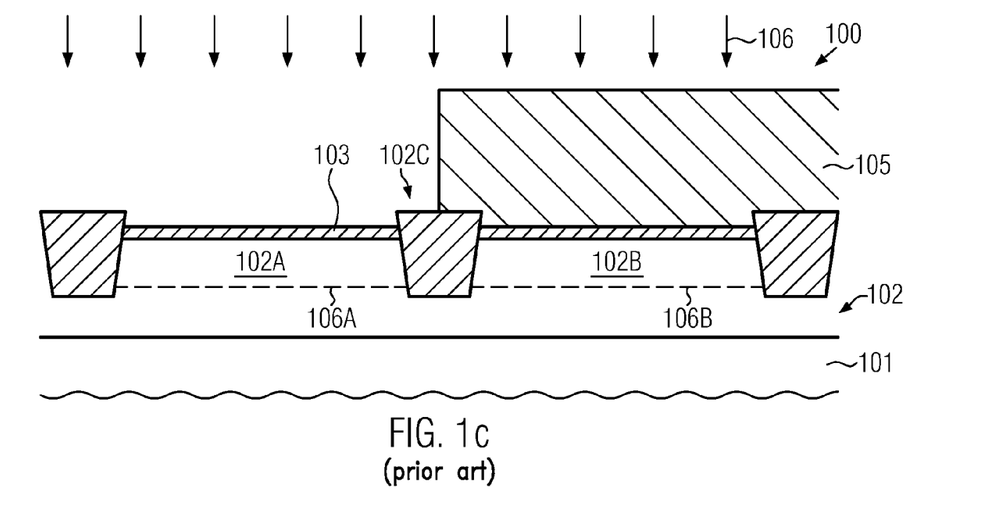

FIG. 1c schematically illustrates the device 100 in a further advanced manufacturing stage. As shown, appropriate dopant species 106A, 106B are incorporated into the active regions 102A, 102B in order to adjust the overall transistor characteristics. For example, appropriate well dopant species, threshold voltage adjusting species and the like are incorporated into the active regions 102A, 102B by applying any appropriate masking regime in combination with corresponding implantation techniques. For example, a resist mask 105 is illustrated so as to cover the active region 102B and a portion of the isolation region 102C, while an ion implantation process 106 performs so as to incorporate one or more dopant species, such as the species 106A. Thus, a plurality of resist removal processes have to be applied in combination with corresponding cleaning recipes, which may typically cause a certain degree of material erosion in the pad oxide layer 103 and also in the isolation regions 102C. Due to certain alignment inaccuracies, in particular in the isolation region 102C, that laterally separates active regions of inverse conductivity type, such as the regions 102A, 102B, minor inaccuracies during the formation of the corresponding resist masks may result in a certain degree of recessing (not shown) which typically results in a certain surface topography.

Figure 1D:
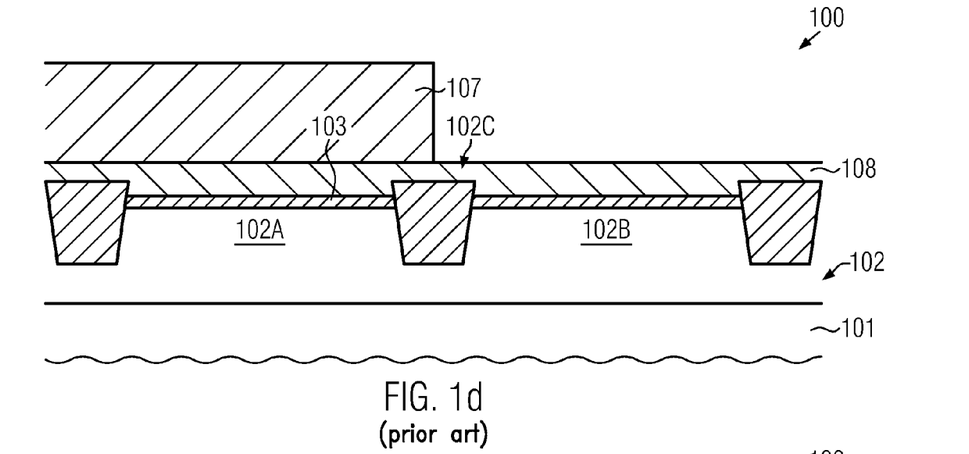

FIG. 1d schematically illustrates the device 100 in a further advanced manufacturing stage. As illustrated, a hard mask material 108, such as an oxide material, a silicon nitride material and the like, is formed above the active regions 102A, 102B and also above the isolation region 102C. To this end, any appropriate deposition technique may be applied, such as plasma assisted chemical vapor deposition (CVD), thermally activated CVD and the like. Moreover, a resist mask 107 is formed above the mask layer 108 in order to cover a portion thereof formed above the active region 102A.

Figure 1E:
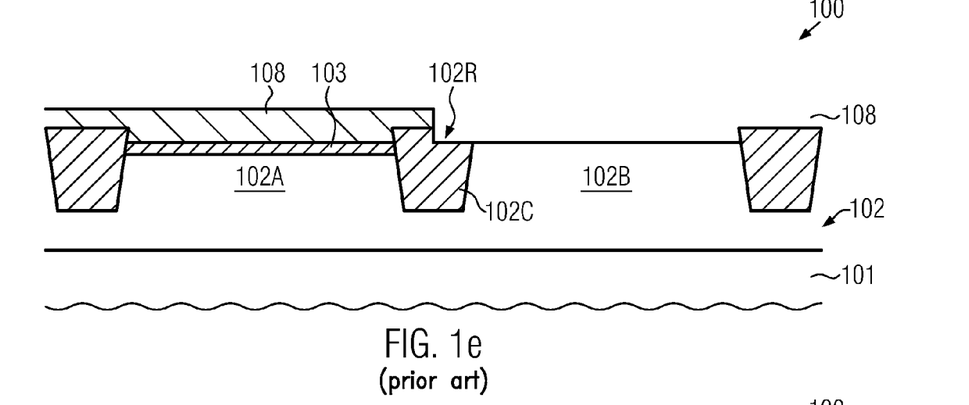

FIG. 1e schematically illustrates the device 100 in a manufacturing stage in which the mask layer 108 is patterned so as to expose the second active region 102B. To this end, any well-established etch recipes are applied in which the resist mask 107 of FIG. 2d is used as an etch mask. Depending on the etch recipe used and moreover depending on the type of material used in the hard mask 108, a pronounced degree of recessing may occur in any exposed isolation regions and also in a corresponding exposed portion of the isolation region 102C, as indicated by 102R. Moreover, a corresponding resist removal process and a cleaning recipe may be applied, which may also contribute to the recess 102R.

Figure 1F:
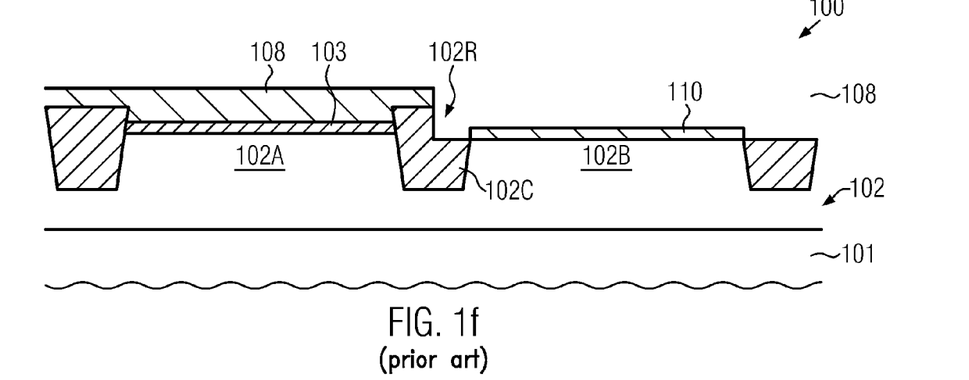

FIG. 1f schematically illustrates the semiconductor device 100 in a further advanced manufacturing stage. As shown, a silicon/germanium material layer 110 is formed on the active region 102B and may thus represent a part thereof so as to enable continuing the further processing on the basis of the region 102B having the desired band gap difference with respect to the active region 102A, as may be required for performing complex gate electrode structures, as is also discussed above.

The device 100 as shown in FIG. 1f is typically formed by exposing the device 100 as shown in FIG. 1e to at least a further cleaning process, which may result in a further recessing of the isolation region 102C, since typically oxide-consuming etch recipes may be applied. In some cases, prior to forming the silicon/germanium alloy 110, a certain degree of recessing, i.e., material removal of the active region 102B, is applied in order to provide superior growth conditions during the subsequent selective epitaxial growth process. Also in this case, the recess 102R may increase in depth, thereby generating a pronounced surface topography with respect to portions of the isolation region 102C, which are still covered by the hard mask 108. Next, the material layer 110 is deposited, which is typically accomplished by using well-established selective epitaxial growth recipes in which process parameters are adjusted such that a pronounced material deposition may be restricted to crystalline surface areas, while a significant material deposition on dielectric surface areas, such as the isolation regions 102C and the hard mask 103, is suppressed. For example, the silicon/germanium layer 110 may be formed with a thickness of 8-12 nm, while germanium contents may be up to 25 atomic percent, depending on the required electronic characteristics of the active region 102B.

Figure 1G:
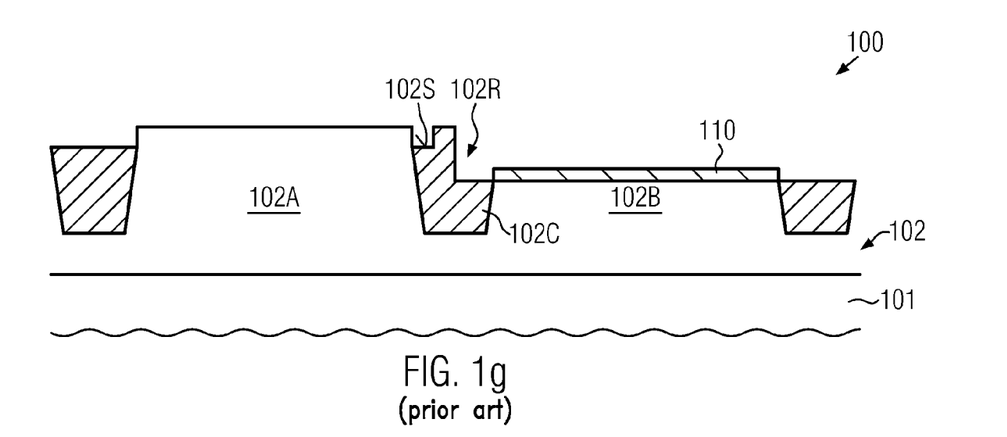

FIG. 1g schematically illustrates the device 100 in a further advanced manufacturing stage, i.e., after the removal of the hard mask 108 and the pad oxide 103 (FIG. 1f), which is typically accomplished by using selective etch recipes, such as hot phosphoric acid and the like when silicon nitride is to be removed and hydrofluoric acid (HF) when a silicon oxide material is to be etched. Consequently, during the corresponding process sequence, also material of the isolation structure 102C may be consumed. In order to reduce the pronounced surface topography, additional mask layers may frequently be applied which, however, may result in more complex surface topography, although the absolute depth of the recesses 102R may be reduced to a certain degree. Consequently, the resulting surface topography 102S may be determined by the preceding processes and may result in a non-symmetric structure, which may still have formed therein recesses 102R with significant depth, although traditional complex masking regimes and corresponding etch techniques may have been applied, for instance by masking the active region 102B during one or more of the etch processes for exposing the active region 102A.

Consequently, the further processing is to be continued on the basis of the pronounced surface topography 102S, which in turn may result in non-uniformities of complex gate electrode structures and thus of any transistors formed in and above the active regions 102A, 102B.

Figure 1H:
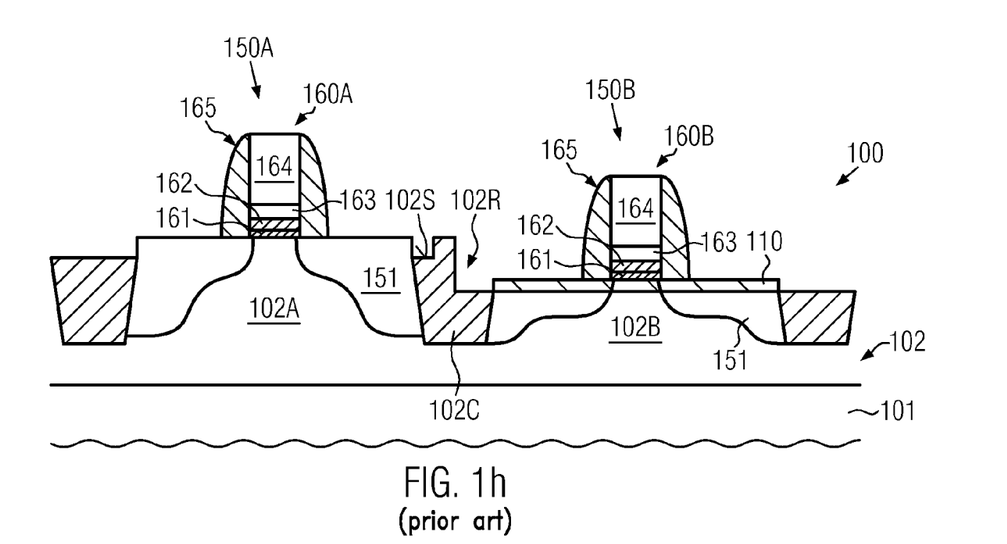

FIG. 1h schematically illustrates the device 100 according to some illustrative examples in a further advanced manufacturing stage. As shown, a transistor 150A is formed in and above the active region 102A and comprises a gate electrode structure 160A. Similarly, a second transistor 150B is formed in and above the active region 102B, which comprises the semiconductor alloy 110. As discussed above, the gate electrode structures 160A, 160B may have a complex configuration, for instance comprising a conventional silicon dioxide-based gate dielectric material 161 in combination with a high-k dielectric material 162, wherein an electrode material, such as titanium nitride, possibly in combination with an additional work function metal species 163, is provided. Furthermore, a semiconductor-based electrode material 164 is typically incorporated in the gate electrode structures 160A, 160B. Moreover, any appropriate spacer structure 165 may be formed on sidewalls of the materials 164, 163, 162 and 161 in order to ensure integrity of these materials and also provide an appropriate mask for forming drain and source regions 151 in the active region 102A. The gate electrode structure 160B may have a similar configuration, however, if required, the layers 162 and/or 163 may differ from the corresponding layers in the gate electrode structure 160A, for instance with respect to the incorporation of any work function metal species, while additionally the semiconductor alloy 110 may provide the desired overall threshold voltage of the transistor 150B. For example, the transistor 150B is a P-channel transistor, while the transistor 150A is an N-channel transistor. The transistors 150A, 150B are formed on the basis of highly complex process techniques which require the deposition and patterning of the layers 161, 162 and 163 so as to comply with a corresponding conductivity type of the transistors 150A, 150B. Thereafter, the electrode material 164 is formed, possibly in combination with additional hard mask materials and the like, followed by a complex lithography process and patterning strategy in order to obtain the gate electrode structures 160A, 160B with a gate length of, for instance, 50 nm and less. It should be appreciated that in particular the deposition and patterning of the materials 162, 163 and also the subsequent patterning of the final gate layer stack may significantly depend on the overall surface topography, wherein, in particular, the pronounced surface topography of the isolation region 102C may contribute to process non-uniformities, which in turn may result in a shift of transistor characteristics, such as gate length, threshold voltage and the like. Similarly, during the further processing, the surface topography essentially created during the formation of the silicon/germanium alloy 110 may also affect the configuration of the spacer structure 165, which in turn may influence the finally obtained dopant profiles of the drain and source regions 151.

It should further be appreciated that, in sophisticated applications, frequently a strain-inducing semiconductor material, such as a silicon/germanium material (not shown), may be incorporated in some active regions, such as the active region 102B, wherein the corresponding process sequence may contribute to an even further pronounced surface topography, which may contribute to a more non-symmetric profiling of the corresponding isolation region 102C.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which the degree of material erosion in isolation regions may be significantly reduced when forming a semiconductor alloy selectively in one type of active region, for instance for adjusting the threshold voltage of complex transistor elements, in which sophisticated high-k metal gate electrode structures are to be provided. To this end, the isolation regions may be appropriately masked by an appropriate protective material, at least during the most critical process steps, which may be accomplished by using an appropriate material having the desired etch selectivity with respect to other mask layers or mask layer stacks, which may be used for selectively exposing one type of active region and forming therein the desired semiconductor alloy, such as a silicon/germanium alloy and the like. Consequently, by appropriately masking the isolation regions, superior flexibility may be achieved with respect to applying any appropriate masking regime for forming an etch and/or deposition mask for the selective epitaxial growth process. For example, any sacrificial materials, such as a pad oxide and a silicon nitride material, which may be provided prior to actually forming the isolation region may be efficiently used in combination with the protective mask material formed above the isolation regions, while, in other cases, dedicated hard mask materials, for instance formed by deposition and/or oxidation, may be applied in combination with or alternatively to any pad oxide or pad nitride materials, depending on the desired overall process flow.

One illustrative method disclosed herein comprises forming a protective material layer selectively above an isolation region that laterally separates a first active region from a second active region, which are formed in a semiconductor layer of a semiconductor device. The first and second active regions are covered by at least one mask layer. The method further comprises forming an etch mask above the first active region and a portion of the isolation region so as to expose the at least one mask layer above the second active region. Moreover, the method comprises removing the at least one mask layer from above the second active region selectively to the protective material layer in the presence of the etch mask. The method additionally comprises forming a semiconductor alloy on the second active region by using one or more of the at least one mask layer formed above the first active region as a deposition mask. Additionally, the method comprises forming a first transistor in and above the first active region and a second transistor in and above the second active region.

A further illustrative method disclosed herein comprises forming an isolation region in a semiconductor layer of a semiconductor device so as to laterally delineate a first active region and a second active region in the semiconductor layer. The method further comprises forming a mask layer stack selectively above the first and second active regions, wherein the mask layer stack comprises a first mask layer and a second mask layer formed below the first mask layer. Moreover, a protective material layer is formed above the isolation region and the first mask layer is removed from above the first and second active regions selectively to the protective material layer. Furthermore, the method comprises removing the second mask layer selectively from above the second active region and forming a threshold adjusting semiconductor material selectively on the second active region and using the second mask layer formed above the first active region as a deposition mask.

A still further illustrative method disclosed herein comprises forming an isolation region in a semiconductor layer of a semiconductor device, wherein the isolation region laterally delineates a first active region and a second active region. The method further comprises forming a mask layer stack selectively above the first and second active regions and forming a protective material layer above the isolation region. The method further comprises forming a hard mask so as to expose the mask layer stack above the second active region. Additionally, the first mask layer of the mask layer stack is removed selectively to the protective material layer and the hard mask. Additionally, the method comprises removing the second mask layer and the hard mask and forming a semiconductor alloy selectively on the second active region by using the mask layer stack formed above the first active region as a deposition mask.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, the surface topography obtained after the selective formation of a threshold adjusting semiconductor alloy in one type of active region may be significantly improved compared to conventional strategies by providing an appropriate protective mask material, such as a semiconductor material, for instance in the form of amorphous silicon and the like, or a dielectric material, such as amorphous carbon and the like, at least during critical process steps, which may conventionally contribute to a pronounced material erosion in the isolation structures. To this end, the protective material layer may be formed at any appropriate manufacturing stage, for instance after completing the isolation structures and prior to performing any well implantation process sequence in combination with masking steps, thereby reducing any undue material erosion of the isolation structures. Furthermore, the protective material layer may also be present during critical process steps for patterning corresponding mask layers or mask layer stacks, which may be subsequently used, at least partially, as a deposition mask for selectively forming the semiconductor alloy under consideration.

In some illustrative embodiments disclosed herein, materials, such as a pad oxide, a silicon nitride material and the like, which may be provided prior to actually forming the isolation regions, may also be used as efficient mask materials during the further processing in order to selectively form the semiconductor alloy under consideration, while the additional protective mask material may thus provide superior surface conditions during the critical manufacturing steps. For example, in some illustrative embodiments, the pad oxide material may be used as an efficient deposition mask, while in other illustrative embodiments the pad oxide in combination with a silicon nitride material, as used during the preceding processing, may in combination be used as an efficient growth mask. In other cases, any other appropriate hard mask regime may be applied in combination with a protective material layer formed selectively on the isolation regions, thereby providing a high degree of flexibility in designing the process flow for incorporating the semiconductor alloy selectively in one type of active region.

Figure 2A:
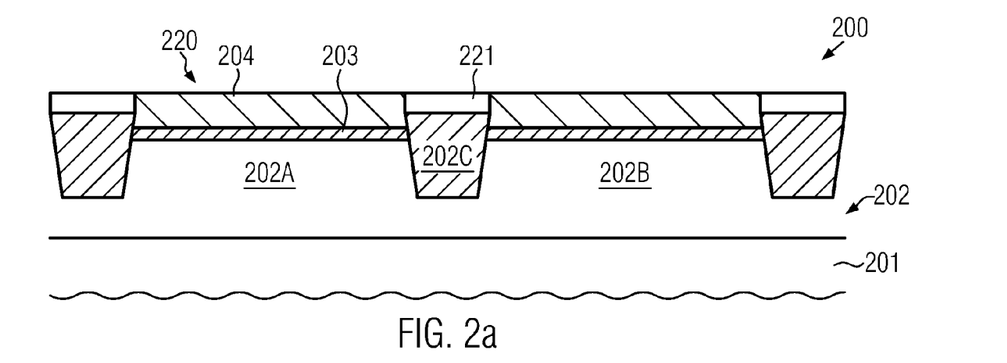
FIGS. 2a-2g schematically illustrate cross-sectional views of a semiconductor device during various manufacturing stages in forming a semiconductor alloy, such as a threshold adjusting semiconductor alloy, selectively in one type of active region by using an appropriate protective mask material formed on isolation regions during critical process steps, according to illustrative embodiments.
Figure 2B:
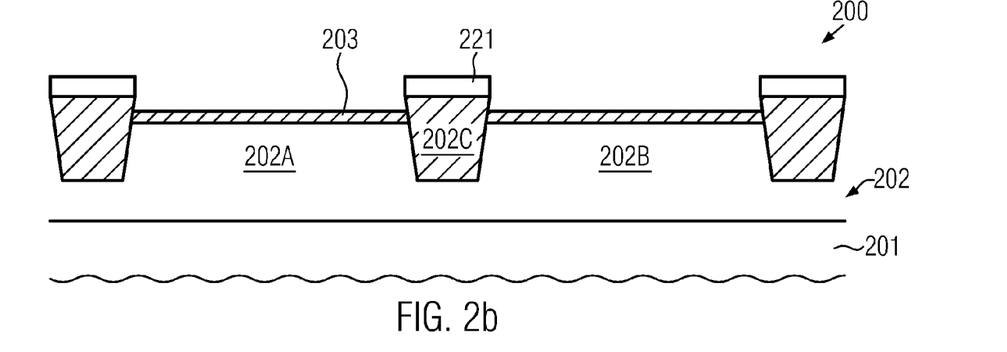
Figure 2C:
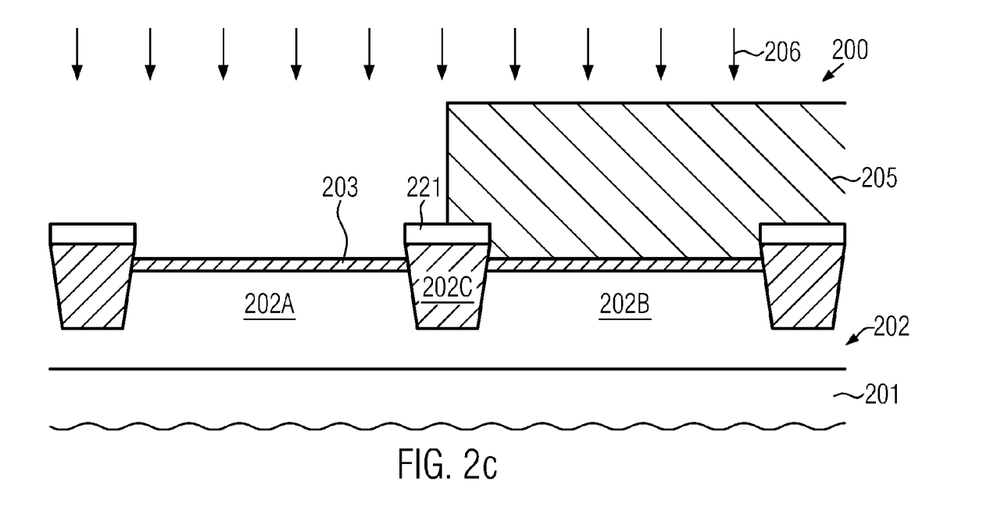
Figure 2D:
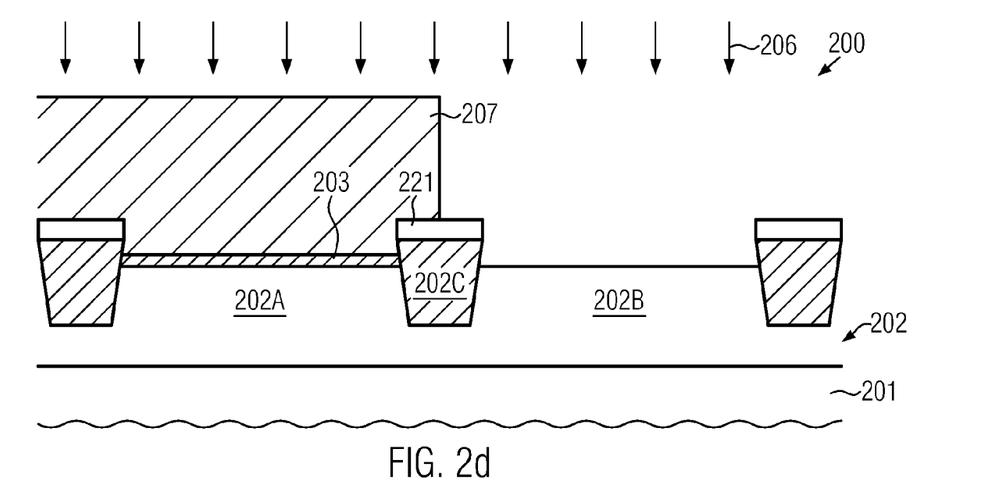
Figure 2E:
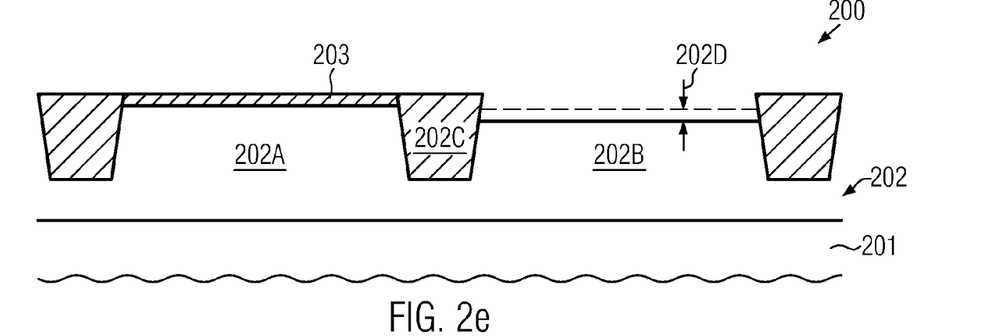
Figure 2F:
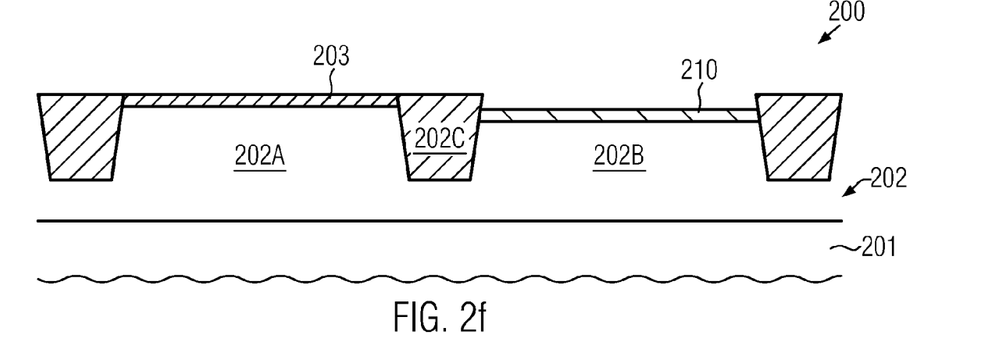
Figure 2G:
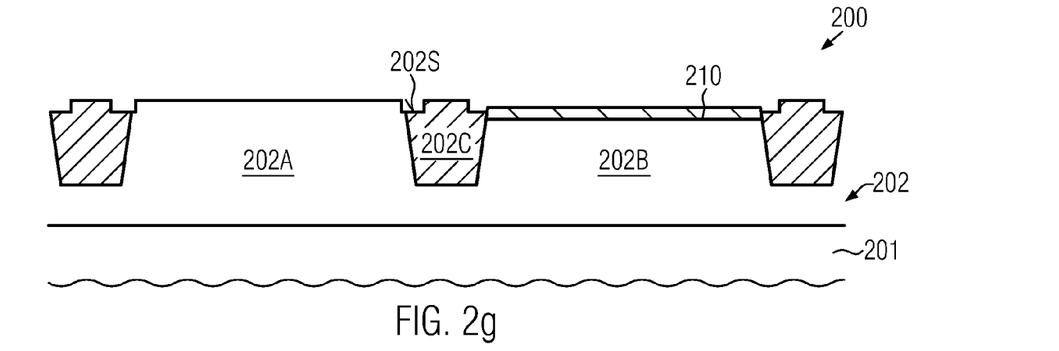
Figure 2H:
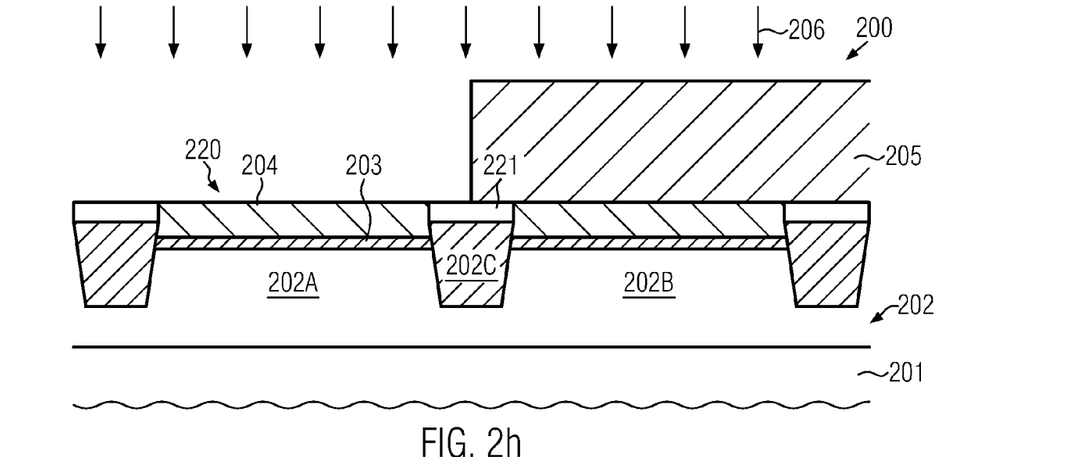
FIGS. 2h-2p schematically illustrate cross-sectional views of the semiconductor device during various manufacturing stages according to still further illustrative embodiments wherein a mask layer stack in combination with a dedicated hard mask may be used for appropriately masking an active region in combination with a protective material layer formed above isolation regions in order to obtain superior surface conditions for the further processing of the semiconductor device after the provision of the threshold adjusting semiconductor alloy.
Figure 2I:
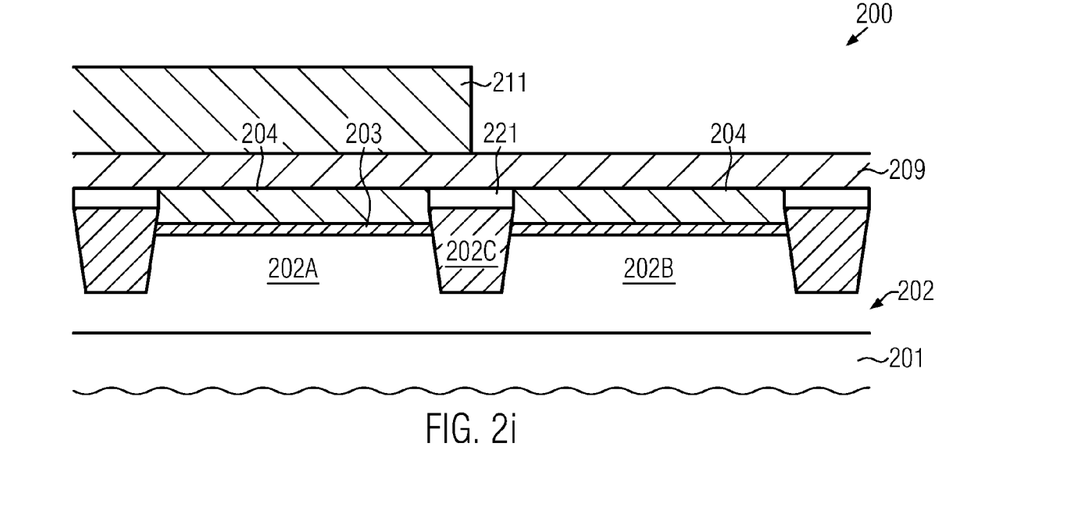
Figure 2J:
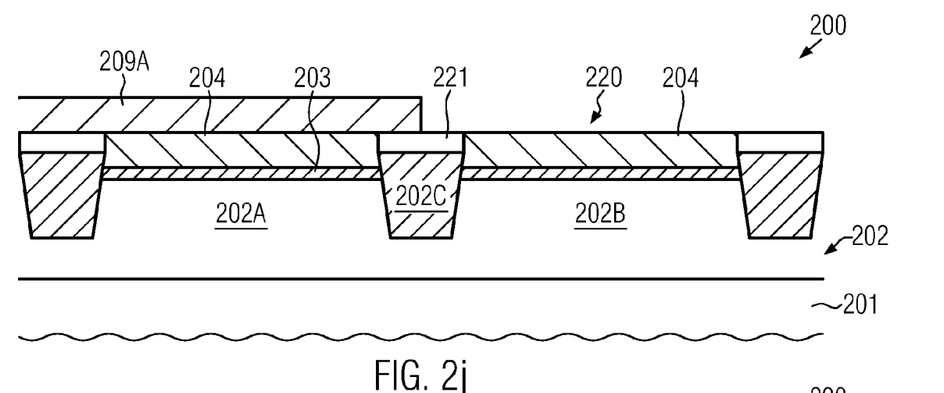
Figure 2K:
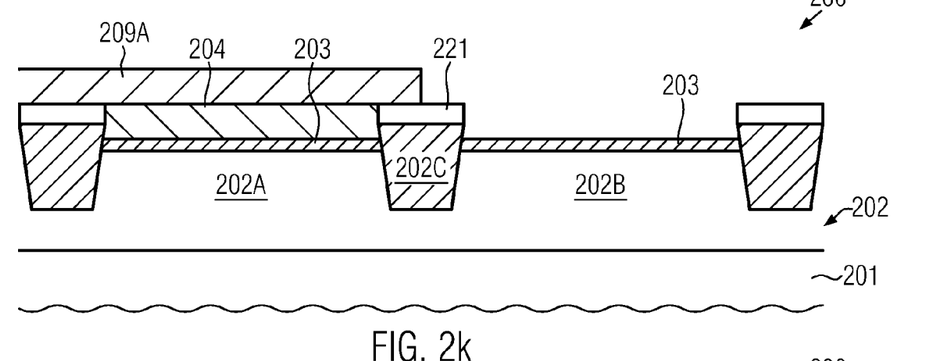
Figure 2L:
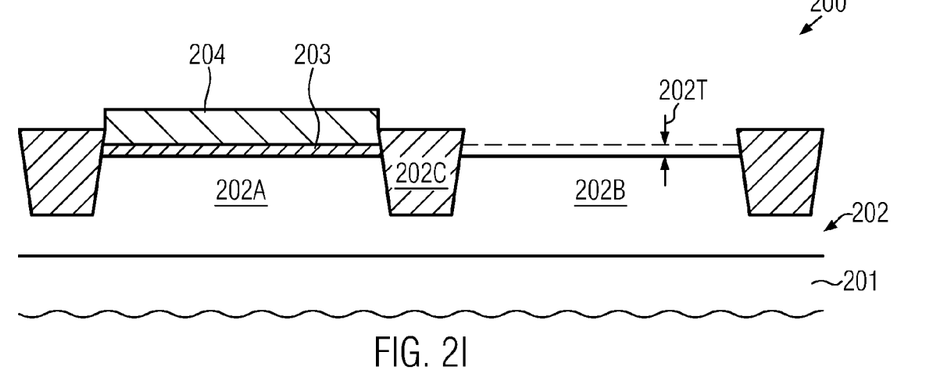
Figure 2M:
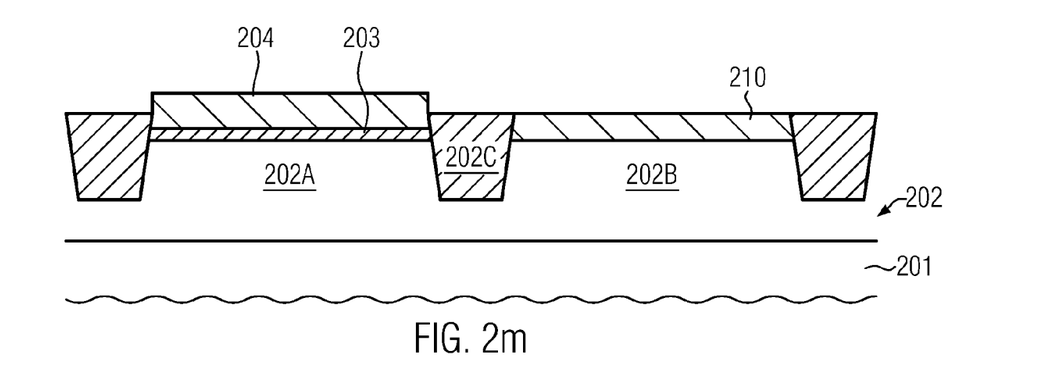
Figure 2N:
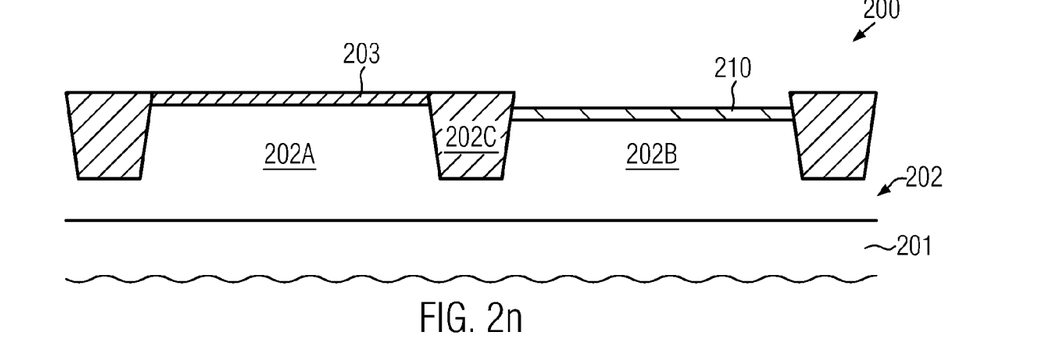
Figure 2O:
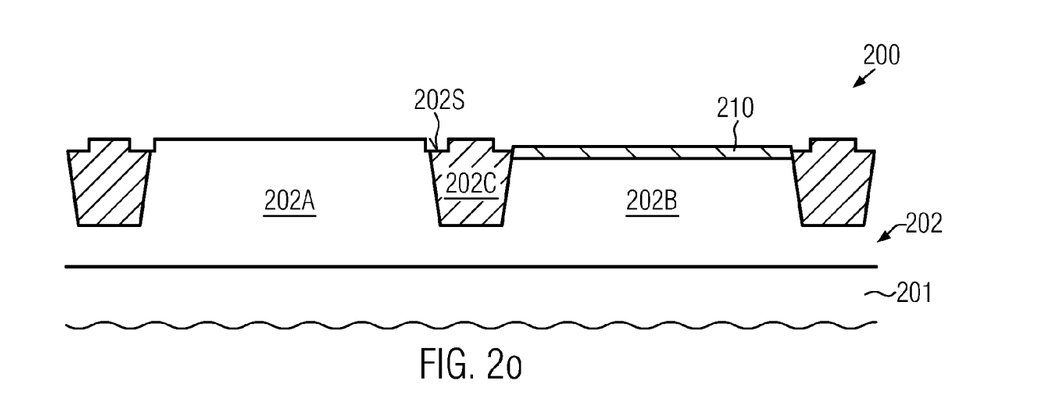

With reference to FIGS. 2a-2o, further illustrative embodiments will now be described in more detail, wherein reference may also be made to FIGS. 1a-1h, if appropriate.

FIG. 2a schematically illustrates a cross-sectional view of a semiconductor device 200 comprising a substrate 201 and a semiconductor layer 202, which may form a bulk configuration, while in other cases a silicon-on-insulator (SOI) configuration may be provided if considered appropriate for the further processing. In this case, a buried insulating material may be formed below the semiconductor layer 102. Furthermore, in the manufacturing stage shown, active regions 202A, 202B are laterally delineated by respective isolation regions, wherein a portion of these isolation regions, indicated by 202C, may laterally separate a first active region 202A from a second active region 202B. It should be appreciated that, with respect to the components described so far, the same criteria may apply as previously explained with reference to the semiconductor device 100. Moreover, in the embodiment shown, a mask layer stack 220, for instance comprising a first mask layer 204, such as a silicon nitride layer and the like, and a second mask layer 203, may be formed on the active regions 202A, 202B. For example, the second mask layer 203 may be provided in the form of a silicon dioxide material having a thickness of 8 nm and higher, while the first mask layer 204 may have a thickness of approximately 10 nm and more. Furthermore, the semiconductor device 200 may comprise a protective mask material 221, which may be selectively formed on the isolation region 202C. In some illustrative embodiments, the material 221 may be comprised of a semiconductor material, such as amorphous silicon, an amorphous silicon/germanium mixture and the like. In this case, the material 221 may have a pronounced etch selectivity to the mask layer 204 with respect to a plurality of well-established etch recipes. In other cases, the material 221 may be provided in the form of an amorphous carbon material, which may also be highly stable with respect to a plurality of wet chemical etch recipes.

The semiconductor device 200 as shown in FIG. 2a may be formed on the basis of any appropriate process strategy for forming the isolation regions 202C and the active regions 202A 202B, as is for instance described above with reference to the device 100. It should be appreciated that in any such process strategies the materials 203 and 204 may be provided with a sufficient initial layer thickness in order to obtain the desired configuration for the layer stack 220, as discussed above. For example, after completing the isolation regions 202C, a similar device configuration may be obtained as previously described with reference to FIG. 1a. Thereafter, the protective material layer 221 may be deposited, for instance, by any well-established deposition technique, thereby reliably filling any recesses formed by the isolation region 202C with respect to the mask layer stack 220. For example, the process for forming the isolation region 202C in combination with selecting appropriate initial thickness values for the layers 203, 204 may result in a recessing of approximately 2-6 nm, depending on the selected process strategy. In some illustrative embodiments, the degree of recessing of the isolation region 202C with respect to the mask layer 204 may be adjusted by performing an additional etch step, for instance using plasma assisted etch recipes, wet chemical etch recipes and the like. Although in this case a material erosion may occur in the isolation regions 202C, any such material removal may be obtained for any isolation regions, thereby not unduly contributing to a pronounced surface topography during the further processing.

After the deposition of the material 221, an appropriate planarization process, such as CMP and the like, may be applied during which any excess material of the protective material layer may be removed, thereby finally exposing the layer 204 above the first and second active regions 202A, 202B and thus selectively providing the material 221 above the isolation regions 202C, as shown in FIG. 2a. It should be appreciated that corresponding CMP recipes may be applied, which may have a similar removal rate for the material 221 and the layer 204 in order to avoid undue "dishing" of the material 221. To this end, well-established CMP recipes may be applied for silicon nitride and silicon, for instance when the material 221 is provided in the form of a polysilicon material.

FIG. 2b schematically illustrates the device 200 in a further advanced manufacturing stage in which the first mask layer 204 (FIG. 2a) may be removed, for instance, on the basis of wet chemical etch recipes, such as hot phosphoric acid, possibly in combination with APM, while in other cases plasma-assisted etch recipes may be applied. Due to the etch selectivity between the materials 221 and the layer 204 (FIG. 2a), integrity of the isolation regions 202C may be preserved. Furthermore, the layer 203 may act as an efficient etch stop material since a plurality of any selective etch recipes between silicon nitride and silicon dioxide are well established.

FIG. 2c schematically illustrates the semiconductor device 200 in a further advanced manufacturing stage according to illustrative embodiments in which appropriate dopant species have to be incorporated into the active regions 202A, 202B, which may be accomplished on the basis of appropriate masking regimes and implantation processes. For example, an implantation mask 205 and an implantation process 206 are illustrated as examples for a corresponding process strategy. Consequently, upon performing any resist removal processes, cleaning processes and the like, the material 221 may still reliably cover the isolation regions 202C, thereby significantly reducing any material loss in isolation regions 202C. It should be appreciated that the implantation parameters of the process 206 and any other processes may be readily adapted to the thickness of the layer 203, which may be accomplished by performing simulation calculations and the like.

It should be appreciated that, in other illustrative embodiments (not shown), the incorporation of any well dopant species and threshold adjusting species may be accomplished prior to actually forming the isolation regions 202C, thereby also efficiently avoiding any undue surface topography in the isolation regions 202C.

FIG. 2d schematically illustrates the device 200 in a further advanced manufacturing stage in which an etch mask 207, such as a resist mask, is formed above the active region 202A. Consequently, based on the mask 207, the layer 203 may be removed from above the active region 202B, which may be accomplished on the basis of plasma assisted etch recipes, thereby avoiding any undue lateral material erosion in the isolation regions 202C. Consequently, the isolation region 202C may still be efficiently protected by the material 221. Thereafter, the mask 207 may be removed and in some illustrative embodiments the processing may be continued by recessing the active region 202B.

FIG. 2e schematically illustrates the device in a corresponding manufacturing stage. As shown, a portion of the active region 202B may be removed, for instance in view of obtaining a desired final height of the active region 202B after the deposition of a semiconductor alloy. To this end, any well-established plasma assisted etch recipes or wet chemical etch recipes may be applied. On the other hand, the corresponding etch process may be selected with respect to a silicon dioxide material so that the mask layer 203 and the isolation regions 202C may act as efficient etch masks. Moreover, in some illustrative embodiments, the material 221 (FIG. 2d) may also be removed during the recessing of the active region 202B, wherein the process parameters and the initial thickness of the material 221 may be appropriately adjusted so as to obtain a desired degree of recessing, as indicated by 202D, while also removing the material 221. Thereafter, any cleaning processes may be applied which may also consume a certain amount of silicon dioxide material which, however, may result in substantially the same material erosion in any of the isolation regions 202C, thereby not contributing to a pronounced regular surface topography within the isolation regions 202C. Moreover, the initial thickness of the mask layer 203 may be appropriately selected so as to take into consideration a corresponding material consumption. For example, hydrofluoric acid may be used for the cleaning process, which may result in a material consumption of approximately 1-2 nm, depending on the overall process strategy, thereby still preserving sufficient material in the layer 203 so as to act as a deposition mask during the further processing.

FIG. 2f schematically illustrates the device 200 in a further advanced manufacturing stage, i.e., after the selective growth of a semiconductor alloy 210 on the active region 202B, which may be accomplished on the basis of well-established recipes.

FIG. 2g schematically illustrates the semiconductor device in a further advanced manufacturing stage, i.e., after the removal of the mask layer 203 (FIG. 2f), which may be accomplished by using an appropriate selective wet chemical etch recipe, such as recipes based on HF, wherein, due to the reduced remaining layer thickness of the material 203 of FIG. 2f, the corresponding amount of material removal in the isolation regions 202C may be moderately small, thereby resulting in a surface topography 202S which may be significantly less compared to the conventional process strategy, as previously described.

With reference to FIGS. 2h-2n, further illustrative embodiments of forming the layer 210 with reduced surface topography in the isolation regions 202C will now be described in more detail.

FIG. 2h schematically illustrates the semiconductor device 200 in a manufacturing stage in which a mask layer stack 220 in combination with the protective material layer 221 may cover the active regions 202A, 202B and the isolation regions 202C. In the embodiment shown, the thickness of the layer 203 may be less compared to the previously described embodiments since the layer stack 220 as a whole may be used as an efficient deposition mask during the further processing. For example, the oxide layer 203 may be provided with a thickness of 1.5-6 nm, while the layer 204 may have a thickness of approximately 8-15 nm, wherein it should be appreciated that these thickness values may depend on the previous process history and thus the initial layer thickness values may be appropriately selected so as to comply with the previous processing for forming the isolation regions 202C, as is also discussed above. Furthermore, in some illustrative embodiments as shown in FIG. 2h, a plurality of implantation processes and masking steps may be performed in order to incorporate appropriate well dopant species and threshold adjusting species into the active regions 202A, 202B, wherein, as an example, the implantation process 206 and the implantation mask 205 are illustrated. During the corresponding implantation processes, the process parameters, such as implantation energy, dose and the like, have to be appropriately adapted to the configuration of the mask layer stack 220, which may be readily achieved by experiments, simulations and the like. Consequently, during the various masking steps, including corresponding resist strip processes and cleaning steps, a material loss in the isolation regions 202C and also in the layer 203 may be avoided.

FIG. 2i schematically illustrates the device 200 in a further advanced process phase in which a hard mask material 209 is formed above the layer 204 and the protective material layer 221, wherein, in some illustrative embodiments, the mask layer 209 may be provided in the form of a silicon dioxide material in order to provide superior etch selectivity with respect to the material layer 204 and the protective material layer 221. Moreover, an etch mask 211, such as a resist mask, may be formed above the active region 202A.

FIG. 2j schematically illustrates the device 200 in a further advanced manufacturing stage in which the mask layer 209

(FIG. 2*i*) is patterned into a mask 209A, which may be accomplished by performing any selective etch recipe, such as plasma assisted processes, followed by resist strip processes, so as to obtain the device 200 as shown in FIG. 2*j*. In this configuration, the exposed portion of the layer 204 may be removed on the basis of selective wet chemical etch recipes or plasma assisted etch recipes, wherein the material 221 and the layer 203 may act as efficient etch stop materials, thereby avoiding undue material loss of the active region 202B and the isolation regions 202C.

FIG. 2*k* schematically illustrates the semiconductor device 200 after the above-described process sequence. Hence, the layer 203 may be exposed above the active region 202B.

FIG. 2*l* schematically illustrates the semiconductor device 200 in a further advanced manufacturing stage. As shown, the mask 209A and the exposed portion of the mask layer 203 (FIG. 2*k*) may be removed, which may be accomplished by applying selective etch recipes for which well-established etch techniques are available, for instance for removing silicon dioxide selectively to silicon material. Consequently, in this etch process, the active region 202B may be exposed, while at the same time the mask 209A (FIG. 2*k*) may be removed, thereby exposing the layer 204. In a further etch process, such as a selective plasma assisted etch process, a recess 202T may be formed in the active region 202B, which may be accomplished by isotropic plasma assisted etch techniques, which are well established for silicon material. In this case, also protective materials 221 (FIG. 2*k*) may be efficiently removed, wherein material loss in the isolation regions 202C may be very low due to the high degree of selectivity of the corresponding etch process. Consequently, the recess 202T may have a depth that may correspond to at least the layer thickness of the material 221, wherein, however, an increased depth may be achieved without undue material loss in the isolation regions 202C due to the pronounced selectivity of the corresponding etch process. In this manufacturing stage, any pre-cleaning processes prior to the selective epitaxial growth process may be performed, which may result in a certain degree of material loss in the isolation regions 202C, however in a highly uniform manner, thereby not unduly contributing to a pronounced irregular surface area of the isolation regions 202C.

FIG. 2*m* schematically illustrates the device 200 in a further advanced manufacturing stage in which the material layer 210 may be provided as a part of the active region 202B, wherein superior uniformity may be achieved due to the previous processing, wherein a thickness of the layer 210 may be adjusted in accordance with device requirements. Moreover, the degree of recessing 202T (FIG. 2*l*) may be adjusted so as to obtain, in combination with a desired target thickness of the layer 210, a desired final surface topography, for instance with respect to the active region 202A, in order to even further enhance the further processing of the device 200. During the selective epitaxial growth process, the layer 204 may act as an efficient deposition mask, wherein the corresponding process parameters may be readily adapted so as to avoid or substantially suppress any material deposition on the layer 204 and on the isolation regions 202C.

FIG. 2*n* schematically illustrates the device 200 in a further advanced process phase in which the mask layer 203 may be exposed above the active region 202A, which may be accomplished by applying any appropriate etch recipe, such as hot phosphoric acid, possibly in combination with APM, in order to remove silicon nitride material selectively with respect to oxide material. Moreover, a certain degree of material loss of the layer 210, for instance in the range of 1-3 nm, may be taken into account by appropriately adapting the initial thickness of the layer 210. Thereafter, the moderately thin layer 203 may be removed on the basis of highly selective etch recipes, wherein also a certain degree of material loss in the isolation regions 202C may occur, however, due to the reduced thickness of the layer 203, in a very limited manner.

FIG. 2*o* schematically illustrates the device 200 after exposing the active region 202A, which may result in a certain degree of recessing and thus surface topography 202S, however, to a significantly lesser degree compared to conventional strategies.

Consequently, also in these illustrative embodiments in which the mask layer stack 220 (FIG. 2*h*) may be used as a deposition mask, the overall surface topography of the device 200 after forming the layer 210 may be enhanced, for instance in terms of height difference between the active regions 202A, 202B and in particular with respect to the surface topography 202S obtained in the isolation regions 202C. Consequently, the further processing, i.e., the formation of transistors in and above the active regions 202A, 202B, may be continued on the basis of superior process conditions.

Figure 2P:
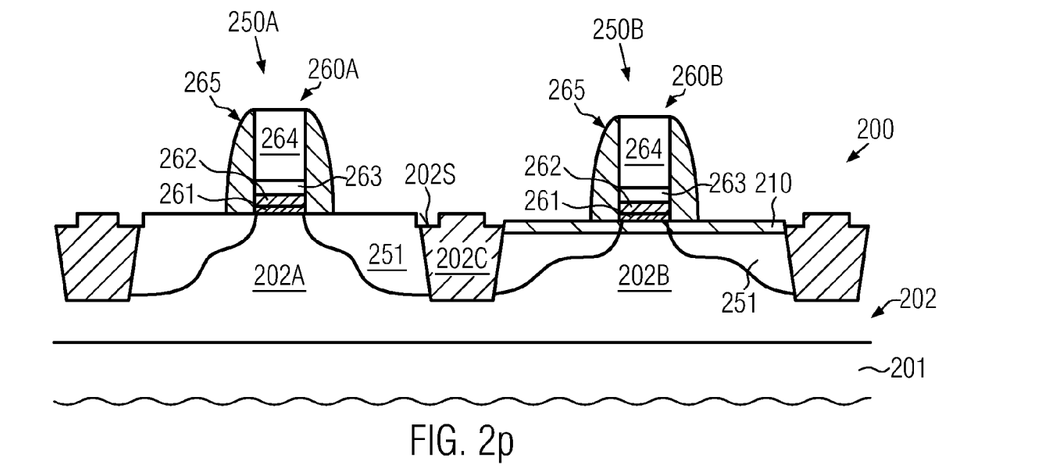

FIG. 2*p* schematically illustrates the device 200 in a further advanced manufacturing stage. As illustrated, a first transistor 250A may be formed in and above the active region 202A and may comprise a gate electrode structure 260A, which may have any appropriate configuration in terms of gate length, material composition and the like. In some illustrative embodiments, a gate length of the structure 260A may be 40 nm and less. The gate electrode structure 260A may comprise a gate dielectric material 261, such as a silicon oxynitride material and the like, with an appropriate thickness. In sophisticated applications, the layer 261 may be provided with a very reduced thickness of approximately 1 nm and less, followed by a high-k dielectric material 262 in combination with a metal-containing electrode material 263, wherein the layers 262 and/or 263 may also comprise appropriate work function metal species, such as lanthanum and the like, in order to obtain a desired work function, which in combination with the overall configuration of the active region 202A may result in a desired threshold voltage of the transistor 250A. Moreover, the gate electrode structure 260A may comprise a further electrode material 264, such as a semiconductor base material, and an appropriate sidewall spacer structure 265. Similarly, a second transistor 250B may be formed in and above the active region 202B and may comprise a gate electrode structure 260B, which may have a similar configuration as the gate electrode structure 260A. For example, in the case of a sophisticated high-k metal gate electrode structure, the layers 261, 262, 263 and 264 may also be provided in the gate electrode structure 260B, wherein, however, appropriate work function adjusting species may be incorporated into the layers 262 and/or 263 in order to obtain, in combination with the previously formed semiconductor alloy 210, the desired threshold voltage. Furthermore, appropriate dopant profiles may be established so as to form corresponding drain and source regions 251, which may be accomplished by ion implantation, selective epitaxial growth techniques and the like.

The transistors 250A, 250B may be formed on the basis of any appropriate process strategy, as is for instance previously discussed with reference to the semiconductor device 100. Contrary to the conventional approach, however, critical processes, such as the patterning of gate electrode structures 260A, 260B, the deposition and patterning of sensitive materials such as high-k materials, metal-containing electrode materials and the like, if provided, may be performed on the basis of superior process conditions due to the reduced overall surface topography. Furthermore, the implementation of any further performance enhancing mechanisms, such as the incorporation of a strain-inducing semiconductor material (not shown) in one or both of the active regions 202A, 202B, may also be accomplished with a significantly reduced resulting surface topography and thus transistor variability.

As a result, the present disclosure provides manufacturing techniques in which a semiconductor alloy, such as a silicon/germanium alloy, may be formed in an earlier manufacturing stage selectively in one type of active region by selective epitaxial growth techniques, wherein undue material loss, in particular in the isolation region, may be reduced during the preceding processing, for instance when incorporating dopant species into the active regions, forming an appropriate deposition mask and the like, so that any process non-uniformities in subsequent critical process steps, in particular when highly sophisticated metal gate electrode structures are to be provided, may be reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a protective material layer selectively above an isolation region that laterally separates a first active region from a second active region formed in a semiconductor layer of a semiconductor device, said protective material layer covering an entire upper surface of said isolation region, said first and second active regions being covered by at least one mask layer;
   forming an etch mask above said first active region and a portion of said isolation region so as to expose said at least one mask layer above said second active region;
   removing said at least one mask layer from above said second active region selectively to said protective material layer in the presence of said etch mask;
   forming a semiconductor alloy on said second active region by using one or more of said at least one mask layer formed above said first active region as a deposition mask; and
   forming a first transistor in and above said first active region and a second transistor in and above said second active region.

2. The method of claim 1, wherein forming said protective material layer selectively above said isolation region comprises depositing at least one of a semiconductor material and a dielectric material above said upper surface of said isolation region and above an upper surface of said at least one mask layer and thereafter performing a planarization process so as to expose said upper surface of said at least one mask layer while forming said protective material layer from said at least one of said semiconductor material and said dielectric material.

3. The method of claim 1, further comprising removing a first one of said at least one mask layer from above said first and second active regions and preserving a second one of said at least one mask layer above said first and second active regions after forming said protective material layer.

4. The method of claim 3, wherein forming said semiconductor alloy comprises using said second mask layer above said first active region as said deposition mask.

5. The method of claim 3, further comprising separately incorporating dopant species into said first and second active regions through said second mask layer after removing said first mask layer.

6. The method of claim 1, further comprising separately incorporating dopant species into said first and second active regions through said at least one mask layer prior to forming said semiconductor alloy.

7. The method of claim 1, further comprising separately incorporating dopant species into said first and second active regions prior to forming said isolation region.

8. The method of claim 1, further comprising removing material from said second active region so as to form a recess by using said one or more of said at least one mask layer as a hard mask.

9. The method of claim 8, wherein forming said recess comprises removing said protective material layer from above said isolation region.

10. The method of claim 8, wherein forming said recess comprises using said at least one mask layer as a hard mask.

11. The method of claim 1, wherein said at least one mask layer is formed prior to forming said isolation region.

12. The method of claim 1, wherein one of said at least one mask layer is formed after forming said isolation region.

13. The method of claim 1, wherein a sidewall of said protective material layer contacts a sidewall of at least a portion of said at least one mask layer.

14. The method of claim 1, wherein, prior to forming said protective material layer, said upper surface of said isolation region is recessed relative to an upper surface of said at least one mask layer, said recessed upper surface of said isolation region and sidewalls of said at least one mask layer defining a first recess, said protective material layer being formed in said first recess.

15. A method, comprising:
   forming an isolation region in a semiconductor layer of a semiconductor device so as to laterally delineate a first active region and a second active region in said semiconductor layer;
   forming a mask layer stack selectively above said first and second active regions, said mask layer stack comprising a first mask layer and a second mask layer formed below said first mask layer, wherein an entire upper surface of said isolation region is recessed relative to an upper surface of at least said first mask layer of said mask layer stack;
   forming a protective material layer above said isolation region, said protective material layer filling a recess defined by said recessed entire upper surface of said isolation region and sidewalls of at least said first mask layer of said mask layer stack;
   removing said first mask layer from above said first and second active regions selectively to said protective material layer;
   removing said second mask layer selectively from above said second active region; and
   forming a threshold adjusting semiconductor material selectively on said second active region and using said second mask layer formed above said first active region as a deposition mask.

16. The method of claim 15, further comprising separately implanting dopant species into said first and second active regions after removing said first mask layer and prior to removing said second mask layer selectively from above said second active region.

17. The method of claim 15, further comprising removing said protective material layer and material of said second active region by performing a common etch process and using said second mask layer as an etch mask above said first active region.

18. The method of claim 15, wherein at least one layer of said mask layer stack is formed prior to forming said isolation region.

19. The method of claim 18, wherein said first and second mask layers are formed prior to forming said isolation region.

20. The method of claim 15, wherein, prior to forming said threshold adjusting semiconductor material selectively on said second active region, forming a recess in said second active region and removing said protective material layer from above said isolation region during a common etching process.

21. The method of claim 15, wherein forming said recessed upper surface of said isolation region comprises performing at least one of a chemical mechanical polishing process and an etching process.

22. A method, comprising:
   forming an isolation region in a semiconductor layer of a semiconductor device, said isolation region laterally delineating a first active region and a second active region;
   forming a mask layer stack selectively above said first and second active regions;
   forming a protective material layer above said isolation region, wherein forming said protective material layer comprises completely filling a recess formed above said isolation region with at least one of a semiconductor material and a dielectric material, a bottom of said recess being defined by an entire upper surface of said isolation region and sidewalls of said recess being defined by at least a portion of said mask layer stack;
   forming a hard mask so as to expose said mask layer stack above said second active region;
   removing a first mask layer of said mask layer stack above said second active region selectively to said protective material layer and said hard mask;
   removing a second mask layer of said mask layer stack above said second active region and said hard mask; and
   forming a semiconductor alloy selectively on said second active region by using said mask layer stack formed above said first active region as a deposition mask.

23. The method of claim 22, further comprising removing said protective material layer and material of said second active region in a common etch process prior to forming said semiconductor alloy.

24. The method of claim 22, wherein forming said protective material layer above said isolation region further comprises performing a planarization process so as to remove an excess portion of said at least one of said semiconductor material and said dielectric material formed outside of said recess and above said mask layer stack, said planarization process exposing said mask layer stack formed above said first and second active regions.

* * * * *